United States Patent
Kuo et al.

[19]

[11] Patent Number: 6,118,689
[45] Date of Patent: Sep. 12, 2000

[54] TWO-PORT 6T CMOS SRAM CELL STRUCTURE FOR LOW-VOLTAGE VLSI SRAM WITH SINGLE-BIT-LINE SIMULTANEOUS READ-AND-WRITE ACCESS (SBLSRWA) CAPABILITY

[76] Inventors: James B. Kuo; Bo-Ting Wang, both of Department of Electrical Engineering, National Taiwan University, Taipei, Taiwan

[21] Appl. No.: 09/427,728

[22] Filed: Oct. 27, 1999

[51] Int. Cl.⁷ ................................................. G11C 11/00
[52] U.S. Cl. .................. 365/154; 365/156; 365/230.05; 365/189.04
[58] Field of Search .................................. 365/154, 156, 365/230.05, 189.04

[56] References Cited

U.S. PATENT DOCUMENTS 5,808,933  9/1998  Ross, Jr. et al. ......................... 365/156
5,831,896  11/1998  Lattimore et al. ....................... 365/154

*Primary Examiner*—Huan Hoang
*Attorney, Agent, or Firm*—Bacon & Thomas, PLLC

[57] ABSTRACT

This invention reports a two-port 6T CMOS SRAM cell structure for low-voltage VLSI SRAM with single-bit-line simultaneous read-and-write access (SBLSRWA) capability. With an unique structure by connecting the source terminal of an NMOS device in the SRAM cell to the write word line, this SRAM cell can be used to provide SBLSRWA capability for 1V two-port VLSI SRAM as verified by SPICE results.

1 Claim, 5 Drawing Sheets

TWO-PORT 6T CMOS SRAM CELL STRUCTURE FOR LOW-VOLTAGE VLSI SRAM WITH SINGLE-BIT-LINE SIMULTANEOUS READ-AND-WRITE ACCESS (SBLSRWA) CAPABILITY

FIELD OF THE INVENTION

The present invention is related to two-port 6T SRAMs with simultaneous read and write capability, and in particular to two-port CMOS VLSI SRAMs with single-bit-line simultaneous read-and-write access capability.

BACKGROUND OF THE INVENTION

In a conventional SRAM cell as shown in FIG. 1(a), double bit lines have been used for read and write accesses—read and write operations are done via the same pair of bit lines. Therefore, while designing two-port memory IC with simultaneous read and write capability, two more pass transistors and an extra pair of bit lines are needed to be incorporated into the memory cell. As a result, the size of the memory cell is increased substantially. If the memory cell structure can be simplified to provide the operation with only one bit line for read and the other bit line for write, the size of this memory cell can be reduced a lot for implementing two-port VLSI SRAM. The difficulty of using the conventional SRAM cell with single-bit-line write access can be perceived from FIG. 1(b). As shown in FIG. 1(b), if logic-1 is to be written from the left bit line WBL via the pass transistor $M_{N1}$ into the left side of the memory cell (node n1), where logic-0 is originally stored. During the write-in operation, the voltage at node n1 cannot be raised to exceed $V_{dd}-V_{TN}$ by the write bit line WBL, where $V_{dd}$ is the power supply voltage and $V_{TN}$ is the threshold voltage of the pass transistor $M_{N1}$. In addition, since the ratioed-logic structure, which is made of the NMOS devices $M_{N1}$ and $M_{N3}$ in the memory cell and the PMOS device $M_{P3}$, which is the driver of the bit line WBL, plus the fact that the electron mobility of the NMOS devices is larger than the hole mobility of the PMOS device, the voltage of node n1 is difficult to be raised during the single-bit-line write-logic-1 operation. As a result, the conventional SRAM cell structure cannot be used for two-port memory circuits with the single-bit-line write-logic-I operation. Although several techniques [T. S. Yang, M. A. Horowitz, and B. A. Wooley, "A 4ns 4Kx1 bit Two-Port BiCMOS SRAM," *IEEE Journal of Solid-State Circuits*, Vol. 23, October 1988, pages 1030–1040; M. Ukita, S. Murakami, T. Yamagata, H. Kuriyama, Y. Nishimura, and K. Anami, "A Single-Bit-Line Cross-Point Cell Activation (SCPA) Architecture for Ultra-Low-Power SRAM's," *IEEE Journal of Solid-State Circuits*, Vol. 28, No. 11, November 1993, pages 1114–1118] have been applied to resolve this difficulty, the penalty cannot be justified for realizing two-port VLSI SRAM.

SUMMARY OF THE INVENTION

The present invention discloses an improved two-port 6T SRAM cell structure for low-voltage VLSI SRAM with single-bit-line simultaneous read-and-write access (SBLSRWA) capability.

The improved two-port 6T SRAM cell structure comprises two PMOS's, designated as $M_{P1}$ and $M_{P2}$; four NMOS's, desiganted as $M_{N1}$, $M_{N2}$, $M_{N3}$ and $M_{N4}$; one write word line; one write bit line; one read word line; and one read bit line, wherein a drain of one NMOS $M_{N3}$ is connected to that of a PMOS $M_{P1}$ at a first node n1 while their gates are tied together at a second node n2; a source of $M_{N3}$ is connected to the write word line instead of to ground as the conventional two-port 6T SRAM cell structure and that of $M_{P1}$ is connected to a supply voltage $V_{dd}$; a drain of another NMOS $M_{N4}$ is connected to that of another PMOS $M_{P2}$ at the second node n2 while their gates are tied together at the first node n1; a source of $M_{N4}$ is connected to the ground and that of $M_{P2}$ is connected to the supply voltage $V_{dd}$; the other two NMOS's are pass transistors, one of them $M_{N1}$ is controlled by the write word line via gate, and its drain and source are connected to the write bit line and the first node n1 respectively; another one of them $M_{N2}$ is controlled by the read word line via gate, and its drain and source are connected to the read bit line and the second node n2 respectively.

In this invention, with an unique structure by connecting the source terminal of an NMOS device ($M_{N3}$) in the SRAM cell to the write word line, this 6T SRAM cell can be used to provide single-bit-line simultaneous read-and-write access capability for 1V two-port VLSI SRAM.

DETAILED DESCRIPTION OF THE INVENTION

Figure 1:
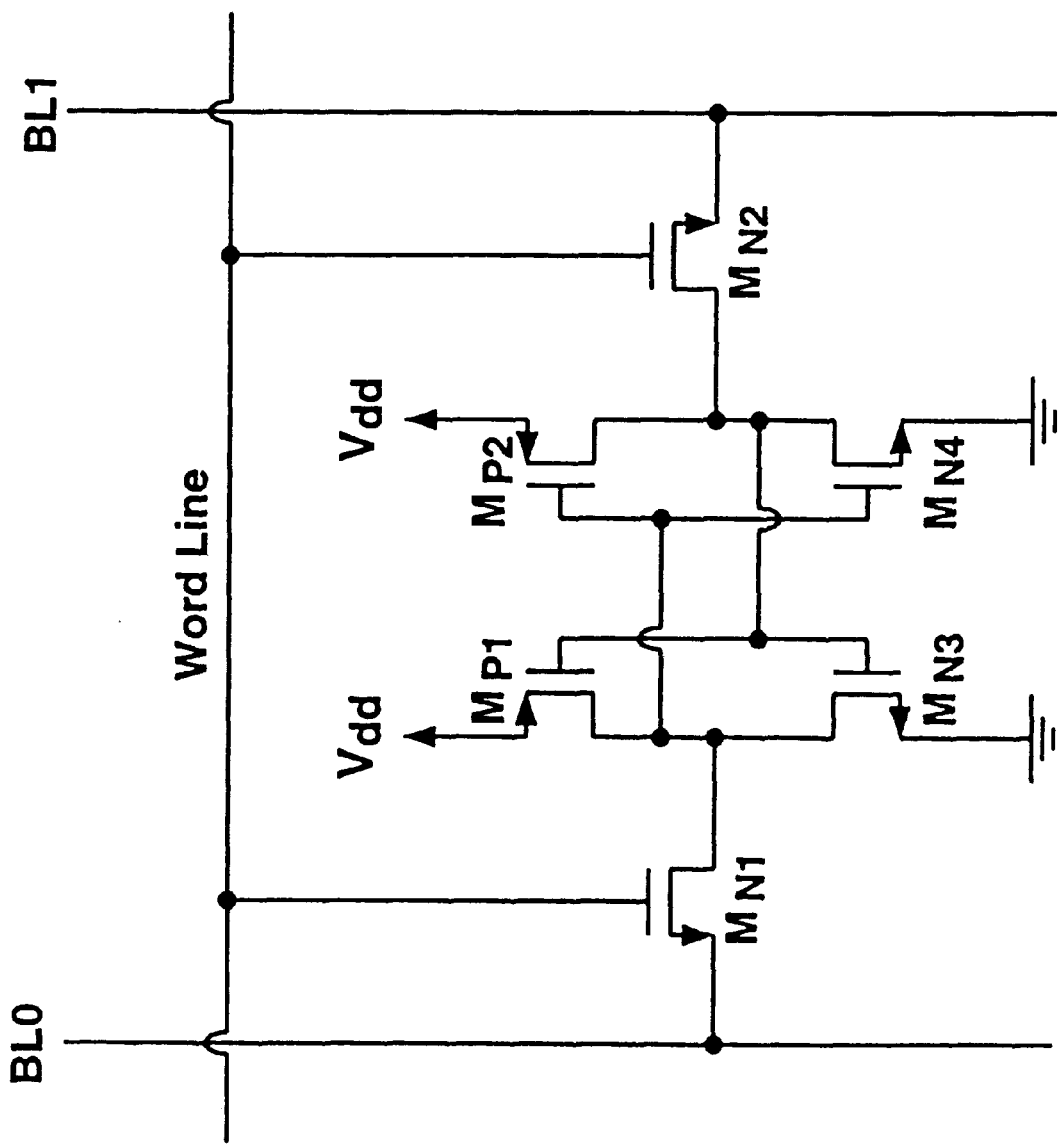
FIG. 1(a) and FIG. 1(b) are schematic diagrams showing a structure and a single-bit-line write-1 operation of the conventional 6T SRAM cell.
Figure 1:
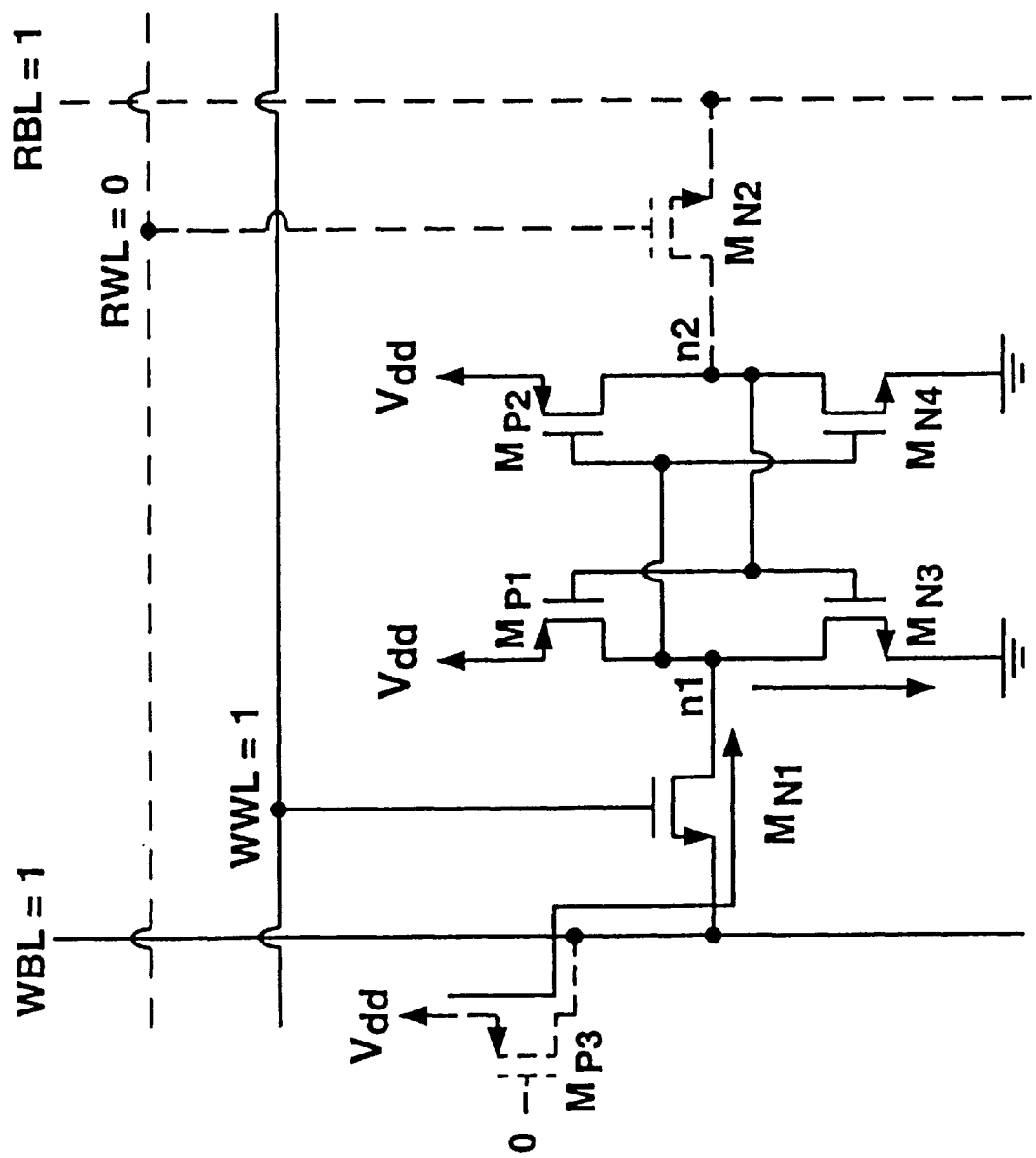
Figure 2:
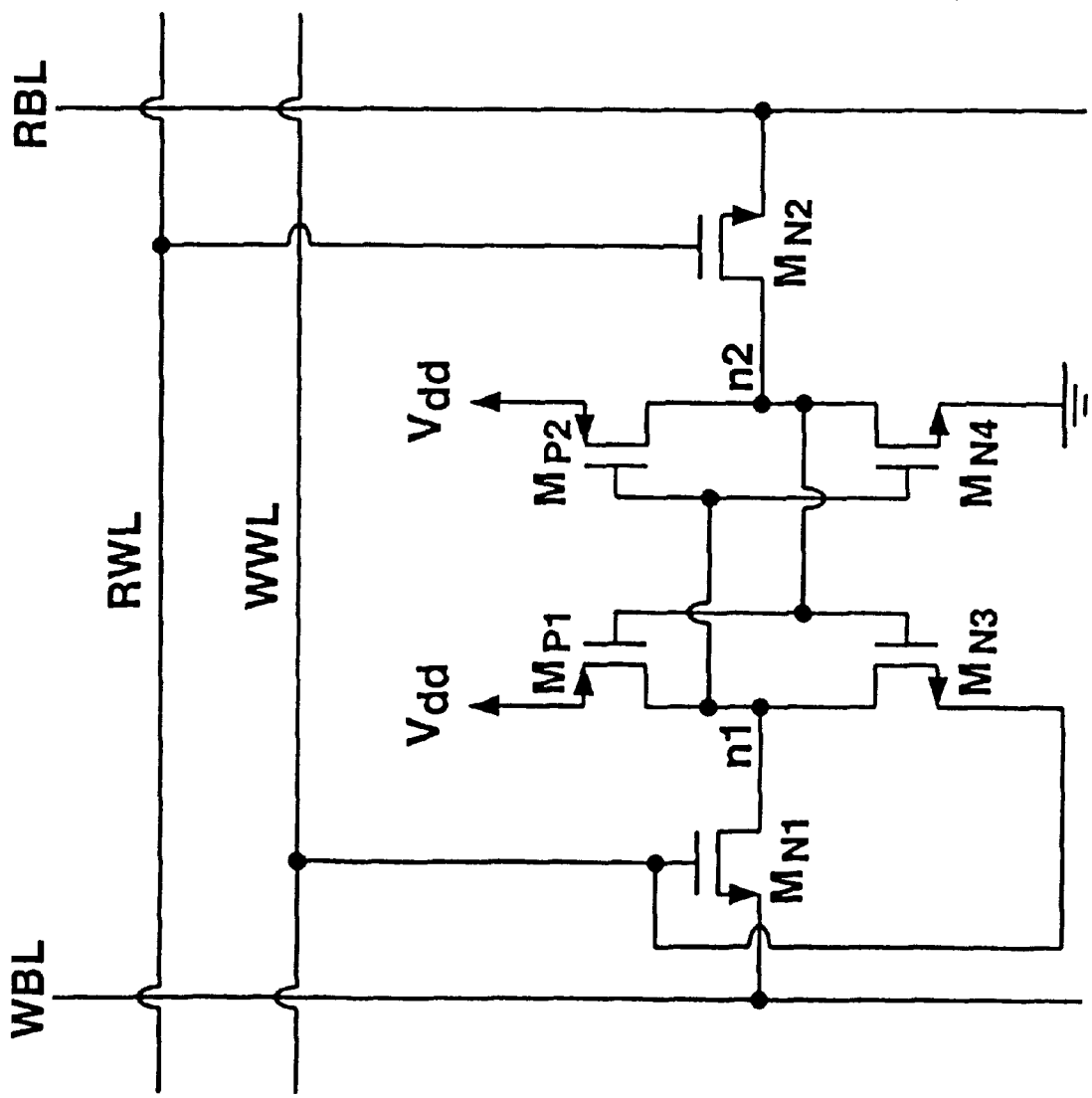
FIG. 2(a) and FIG. 2(b) are schematic diagrams showing a structure and a single-bit-line write-1 operation of the two-port simultaneous read-and-write access (SBLSRWA) 6T SRAM cell of the present invention.
Figure 2:
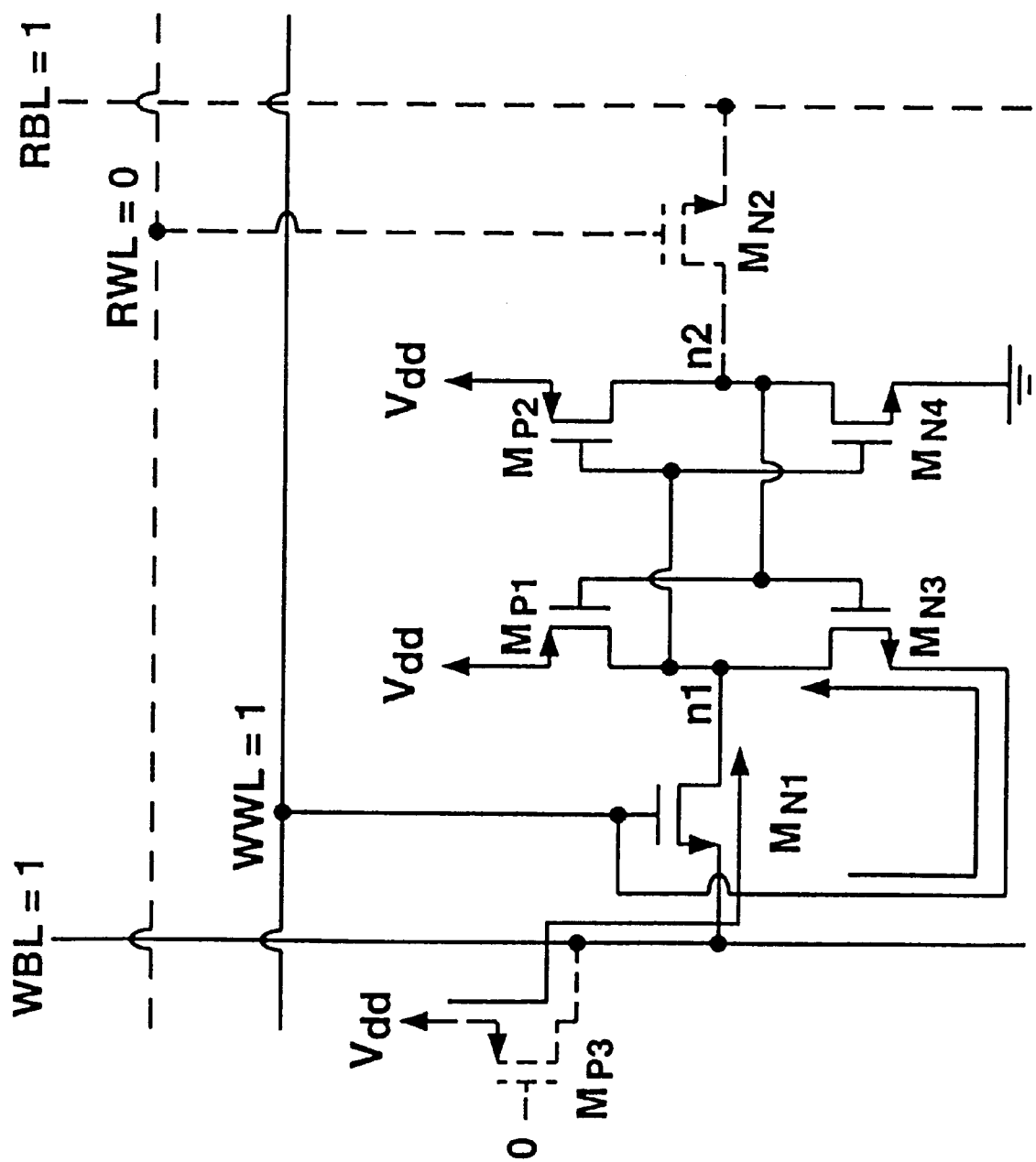

FIG. 2(a) shows the single-bit-line simultaneous read-and-write access (SBLSRWA) two-port 6T SRAM cell constructed according to one of the preferred embodiments of the present invention. As shown in the figure, the source terminal of the NMOS device $M_{N3}$ is connected to the write word line WWL instead of to the ground as in the conventional SRAM cell. In the SBLSRWA memory cell, the left side is connected to the write bit line WBL via the pass transistor $M_{N1}$, which is controlled by write word line WWL. The right side of the SBLSRWA memory cell is connected to the read bit line RBL via the pass transistor $M_{N2}$, which is controlled by the read word line RWL. By this configuration, simultaneous read and write accesses of the SBLSRWA can be facilitated. During the write-logic-1 access, initially, logic-0 is stored at node n1. The previous problem associated with the turn-on of the NMOS device $M_{N3}$ in the conventional SRAM cell for single-bit-line write-logic-1 access can be avoided. Instead, owing to the write word line WWL-connected source terminal of $M_{N3}$, during the single-bit-line write-logic-I operation, the source of the NMOS device $M_{N3}$ is tied to high, usually at $V_{dd}$, as shown in FIG. 2(b). As a result, during the single-bit-line write-logic-I operation, the voltage of node n1 can reach high at $V_{dd}-V_{TN}$ easily. Consequently, $M_{N4}$ turns on and $M_{P2}$ turns off. Thus, the right side of the SBLSRWA cell, node n2, switches to 0V, which makes the voltage of node n1 raised to 1V. This concludes the write-logic-1 operation.

Figure 3:
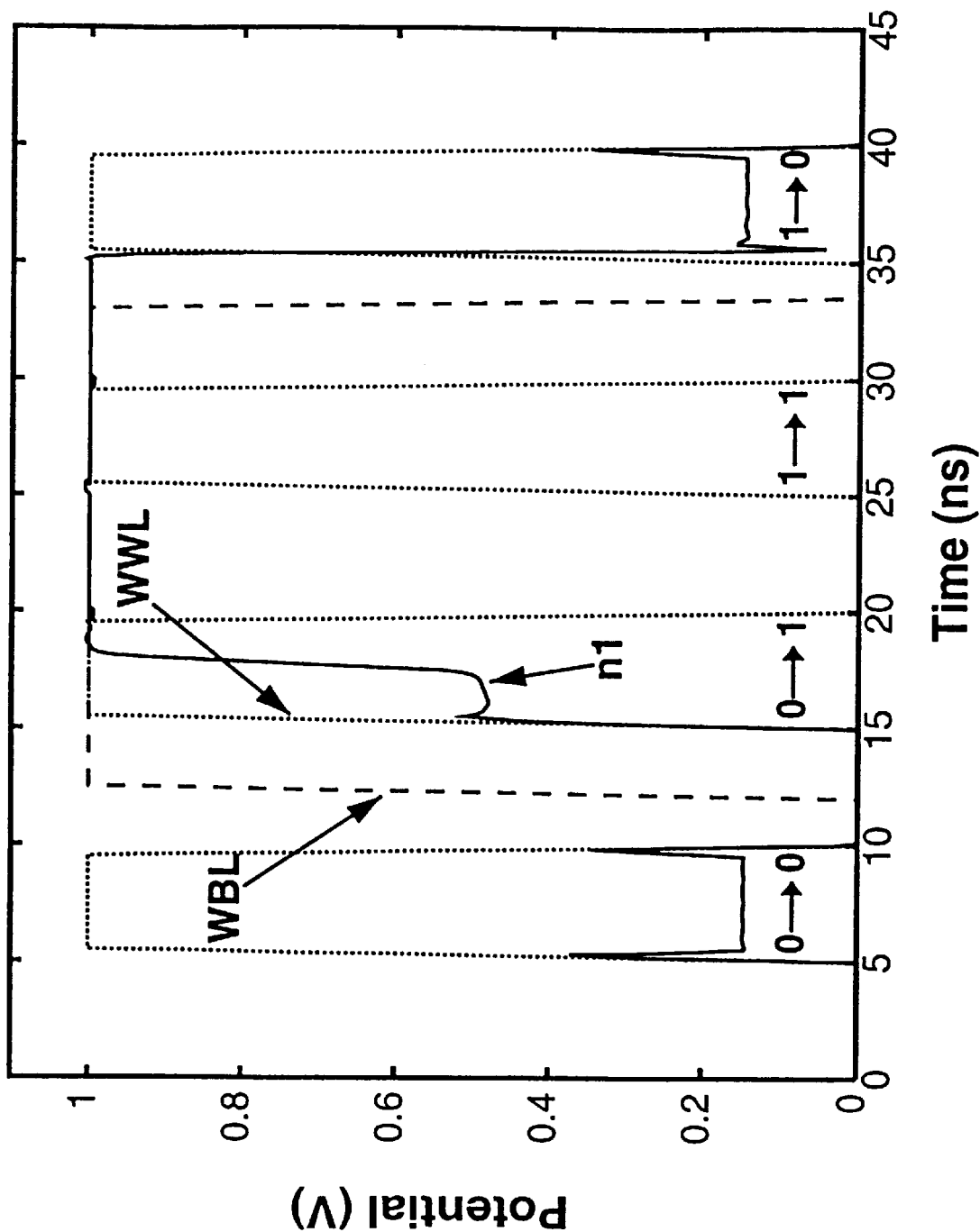
FIG. 3 is a time versus voltage plot showing transients during the write access of the two-port SBLSRWA 6T SRAM cell shown in FIG. 2(a) at $V_{dd}$ of 1V.

In order to verify the effectiveness of the SBLSRWA SRAM cell, transient analysis during simultaneous read and write accesses of the SBLSRWA SRAM cell at a low supply voltage has been carried out. In the SBLSRWA SRAM cell under study, all six transistors have an aspect ratio of 0.3 µm/0.25 µm. Two parasitic capacitors of 0.1 pF are assumed at write and read bit lines (WBL, RBL). Based on a 0.25 µm CMOS technology, FIG. 3 shows the transient waveforms during the write access of the SBLSRWA 6T SRAM cell at $V_{dd}$ of 1V based on SPICE simulation results. As shown in the figure, there are four cases for the write access—(1) logic-0 is written into the storage node n1, which is stored with logic-0 (logic-0→logic-0), (2) logic-1 is written into the storage node n1, which is stored with logic-0 (logic-0→logic-1), (3) logic-1 is written into the storage node n1, which is stored with logic-1 (logic-1→logic-1), (4) logic-0 is written into the storage node n1, which is stored with logic-1 (logic-1→logic-0). The transients associated with these four cases are described below.

Logic-0→Logic-0

In this case, before the single-bit-line write-logic-0 operation is executed (WWL=0), the storage node n1 is at logic-0 (0V) since $M_{N3}$ is on. The write bit line WBL is also at logic-0 (0V). When WWL switches from low to high, write access is initiated. During the initial ramp-up period of WWL with its voltage before reaching the threshold voltage of $M_{N1}$ ($V_{TN}$), node n1 is being charged with its voltage rising with WWL since $M_{N3}$ is on. Note that at this time $M_{N1}$ is off. During the ramp-up period of WWL with a voltage greater than the threshold voltage of $M_{N1}$ ($V_{TN}$), $M_{N1}$ turns on. At this time, since the write bit line is at logic-0, node n1 is discharged as shown. Due to the ratioed-logic structure of $M_{N1}$ and $M_{N3}$, the voltage of node n1 is maintained at 0.15V during most of the write-logic-0 access period when WWL is at its logic-1 value (1V). After the write-logic-0 access is over, WWL ramps down. During the initial ramp-down of WWL, the transconductance of $M_{N1}$ becomes smaller. As a result, despite the down-slew of WWL, due to the ratioed-logic structure of $M_{N1}$ and $M_{N3}$, the voltage of node n1 slews upward during the initial ramp-down of WWL. When WWL is below $V_{TN}$, $M_{N1}$ turns off and the voltage of node n1 slews downward with the ramp-down of WWL. When WWL comes down to the logic-0 level (0V), node n1 is also pulled down to 0V. This accomplishes the logic-0→logic-0 write operation.

Logic-0→Logic-1

In this case, before the single-bit-line write-logic-1 operation is executed (WWL=0), the storage node n1 is at logic-0 (0V) since $M_{N3}$ is on. The write bit line WBL is at logic-1 (1V). During the initial ramp-up period of WWL when WWL is smaller than $V_{TN}$, as in the logic-0→logic-0 case, node n1 is being charged with its voltage rising with WWL since $M_{N3}$ is on. When WWL is greater than $V_{TN}$, $M_{N1}$ turns on. Different from the situation in the logic-0→logic-0 case, node n1 rises further since WBL is now at 1V instead of 0V. As a result, $M_{N1}$ also helps charging node n1 toward $V_{dd}$-$V_{TN}$. The rise in node n1 is coupled to node n2—the gate of $M_{N3}$ has a transient pulse with its peak greater than $V_{dd}$. Therefore, node n1 also has a transient pulse with its peak exceeding $V_{dd}$-$V_{TN}$. Then, $M_{P2}$ turns off and $M_{N4}$ turns on—node n2 falls to 0V. Consequently, $M_{P1}$ turns on and node n1 is pulled up to $V_{dd}$ of 1V to conclude the write-logic-1 operation.

Logic-1→Logic-1

In this case, before the single-bit-line write-logic-1 operation is executed, $M_{N3}$ is off and both WBL and node n1 are at 1V. When WWL switches from low to high, $M_{N1}$ will not turn on because its $V_{GS}$ is equal to 0. At this time, since both $M_{N1}$ and $M_{N3}$ are off, node n1 maintains its logic-1 potential stably throughout the whole write-logic-1 cycle.

Logic-1→Logic-0

In this case, before the single-bit-line write-logic-0 operation is executed, node n1 is at logic-1 (1V) since $M_{N3}$ is off. Write bit line WBL is at logic-0 (0V). During the ramp-up of WWL above $V_{TN}$, $M_{N1}$ turns on, thus node n1 is pulled down by the logic-0 of WBL. As a result, $M_{N4}$ turns off and $M_{P2}$ turns on, which leads to the turn-off of $M_{P1}$ and the turn-on of $M_{N3}$. At this time, node n1 is charged by $M_{N3}$ and discharged by $M_{N1}$. As a result, node n1 slews upward to a potential about 0.15V, which is determined by the ratioed-logic structure of $M_{N1}$ and $M_{N3}$ as described in the logic-0→logic-0 case. When the write-logic-0 access is over, WWL ramps down. As in the logic-0→logic-0 case, during the initial ramp-down of WWL, the transconductance of $M_{N1}$ becomes smaller. As a result, despite the down-slew of WWL, due to the ratioed-logic structure of $M_{N1}$ and $M_{N3}$, the voltage of node n1 slews upward during the initial ramp-down of WWL. When WWL is below $V_{TN}$, $M_{N1}$ turns off, and the voltage of node n1 slews downward with the ramp-down of WWL. When WWL comes down to the logic-0 level (0V), node n1 is also pulled down to 0V. This accomplishes the logic-1→logic-0 write operation.

As shown in FIG. 3, among four write cases, during the write pulse when WWL is high, in both logic-0→logic-0 and logic-1→logic-0 cases, node n1 is not at 0V. Instead, node n1 is at 0.15V. This may consume transient power consumption, but can be overcome by shortening the pulse width of WWL. Compared to the conventional two-port 8T memory cell, the SBLSRWA memory cell needs only six transistors. In addition, only two bit lines are required in the SBLSRWA memory cell structure. In contrast, in the conventional two-port 8T memory cell, four bit lines are necessary. Therefore, the SBLSRWA memory cell is much more compact as compared to the conventional two-port 8T memory cell.

What is claimed is:

1. An improved two-port 6T SRAM cell structure comprises two PMOS's, designated as $M_{P1}$ and $M_{P2}$; four NMOS's, desiganted as $M_{N1}$, $M_{N2}$, $M_{N3}$ and $M_{N4}$; one write word line; one write bit line; one read word line; and one read bit line, wherein a drain of the NMOS $M_{N3}$ is connected to that of the PMOS $M_{P1}$ at a first node n1 while their gates are tied together at a second node n2; a source of the PMOS $M_{P1}$ is connected to a supply voltage $V_{dd}$; a drain of the NMOS $M_{N4}$ is connected to that of the PMOS $M_{P2}$ at the second node n2 while their gates are tied together at the first node n1; a source of the NMOS $M_{N4}$ is connected to the ground and that of the PMOS $M_{P2}$ is connected to the supply voltage $V_{dd}$; the NMOS $M_{N1}$ and NMOS $M_{N2}$ are pass transistors, one of them $M_{N1}$ is controlled by the write word line via its gate, and its drain and source are connected to the write bit line and the first node n1 respectively; another one of them $M_{N2}$ is controlled by the read word line via its gate, and its drain and source are connected to the read bit line and the second node n2 respectively, wherein the improvement comprises a source of the NMOS $M_{N3}$ is connected to the write word line.

* * * * *